United States Patent
Kokta

(10) Patent No.: US 10,259,998 B2
(45) Date of Patent: Apr. 16, 2019

(54) METHOD OF INCREASING THE LUMINESCENCE EFFICIENCY OF TITANIUM-DOPED OXIDE CRYSTAL

(71) Applicant: PRECIOSA, a.s., Jablonec nad Nisou (CZ)

(72) Inventor: Milan Kokta, Washougal, WA (US)

(73) Assignee: PRECIOSA, a.s., Jablonec nad Nisou (CZ)

(*) Notice: Subject to any disclaimer, the term of this patent is extended or adjusted under 35 U.S.C. 154(b) by 272 days.

(21) Appl. No.: 15/403,454

(22) Filed: Jan. 11, 2017

(65) Prior Publication Data
US 2017/0233648 A1 Aug. 17, 2017

(30) Foreign Application Priority Data
Jan. 12, 2016 (CZ) ........................................ 2016-13

(51) Int. Cl.
C09K 11/67 (2006.01)
C09K 11/77 (2006.01)
C30B 29/20 (2006.01)
C30B 29/22 (2006.01)
C30B 33/02 (2006.01)

(52) U.S. Cl.
CPC ........ C09K 11/7774 (2013.01); C09K 11/676 (2013.01); C09K 11/7706 (2013.01); C30B 29/20 (2013.01); C30B 29/22 (2013.01); C30B 33/02 (2013.01)

(58) Field of Classification Search
CPC .... C09K 11/7706; C09K 11/676; C30B 33/02
See application file for complete search history.

(56) References Cited

U.S. PATENT DOCUMENTS 4,836,953 A * 6/1989 Kokta ..................... C30B 33/00
                                                        252/301.4 F
4,988,402 A * 1/1991 Kokta ..................... C30B 33/00
                                                        252/301.4 R

FOREIGN PATENT DOCUMENTS

| CS | 269349 | 9/1982 |
| CS | 223542 | 1/1983 |
| CS | 235858 | 9/1984 |

OTHER PUBLICATIONS

Translation for Title and Abstract for CZ 235858, Sep. 17, 1984.*

* cited by examiner

*Primary Examiner* — C Melissa Koslow
(74) *Attorney, Agent, or Firm* — Reinhart Boerner Van Deuren s.c.

(57) ABSTRACT

A method of increasing the luminescence efficiency of titanium-doped oxide crystal, used as a laser material, is disclosed. This is accomplished by tempering the crystal at a temperature from 1750° C. to 50° C. below the melting point of the oxide crystal in a hydrogen protecting atmosphere with a constant partial pressure of the aluminium suboxide $Al_2O$ gas. By applying the method of the present invention, its luminescence efficiency of titanium-doped oxide crystal increases by 10 to 50 percent, and possibly by as much as 100 percent or more compared to previous technological treatments.

20 Claims, No Drawings

METHOD OF INCREASING THE LUMINESCENCE EFFICIENCY OF TITANIUM-DOPED OXIDE CRYSTAL

CROSS-REFERENCE TO RELATED PATENT APPLICATIONS

This patent application claims priority of Czech Republic Patent Application No. 2016-13, which was filed on Jan. 12, 2016, which Czech Republic patent application is hereby incorporated herein by reference.

BACKGROUND OF THE INVENTION

Field of the Invention

The present invention relates generally to a method of increasing the luminescence efficiency of titanium-doped oxide crystal, used as a laser material, and more particularly to the step of tempering the titanium-doped oxide crystal at a temperature from 1750° C. to 50° C. below the melting point of the oxide crystal in a hydrogen-protecting atmosphere with a constant partial pressure of the aluminium suboxide $Al_2O$ gas.

Titanium-doped oxide crystals, such as for example sapphire crystals doped with titanium ions ($Ti^{3+}:Al_2O_3$), are used in the field of construction of tunable lasers.

Materials from which tunable solid state lasers are constructed have been known since the 1980's. For example, the above mentioned material $Ti^{3+}:Al_2O_3$ was first disclosed by P. F. Moulton (Laser Focus, May 1983) as a tunable laser material enabling generating laser radiation in the range of the spectrum of wavelengths from 750 to 900 nm. At the same time, it was disclosed that the absorption spectra range for $Ti^{3+}:Al_2O_3$ ends in the area around 650 nm. However, it was discovered as well that unless special technical precautions are taken related to the valence of doped titanium ions in the sapphire ($Ti^{3+}:Al_2O_3$), the absorption spectra exceed the above mentioned value of 650 nm and intervene negatively into the luminescence spectra of trivalent titanium ions. This extends in the area of from 650 nm to 1100 nm. The appearance of this undesirable absorption suppresses and/or effectively reduces the possible generation of laser radiation in this field of the spectrum. It was also found that only relatively small parts of grown crystals are suitable for laser construction. For example, in case of 1 percent titanium ions concentration in the melt, crystals $Ti^{3+}:Al_2O_3$ prepared by a conventional method exhibit this (parasitical) absorption of light in the wavelength interval (650 nm to 1100 nm) of up to 12 percent per centimeter of length. This undesirable absorption peaks at about 850 nm, i.e. approximately in the mid-range of the tunable band of laser generation. Accordingly, there are efforts to improve the efficiency of these laser materials by eliminating this undesirable parasitical absorption.

One method of enhancing this efficiency was disclosed in U.S. Pat. No. 4,711,696, which disclosed a process demonstrably increasing the fluorescence efficiency of titanium-doped crystals. The subject-matter of this modification is the action of certain precursors during the simultaneous melting in a protecting atmosphere of carbon monoxide (CO) which is heated up to the melting point of the crystals. Advantageously, the carbon monoxide is present even at temperatures usually melting the corresponding initial mixture for subsequent growing of crystals. On the other hand, carbon monoxide may degrade at the melting temperature, i.e., from ca 1600° C. to 2050° C. and higher. Due to this reason, the atmosphere with carbon monoxide is replaced a hydrogen-containing protecting atmosphere which may be present both at the time of melting, at the time of growing, as well as at the time of cooling. This method is primarily applied in crystals, the melting point of which ranges from 1600° C. to 2050° C. and optionally higher. Using carbon monoxide is not convenient, as at these temperatures thermodynamic decomposition of carbon monoxide may occur, as has been mentioned above.

The foregoing methods are usually conducted in a protecting (non-reactive) atmosphere, e.g. using nitrogen, argon, or optionally other inert gases, or mixtures thereof, the atmosphere being refilled with gas guaranteeing reduction ambience. Usually, this atmosphere, when using high-frequency heating, contains about 5 ppm to 1 percent by volume of hydrogen. However, greater concentrations of hydrogen may be used, e.g. 5 ppm to 20 volume percent, but are usually avoided in view of safety concerns. On the other hand, when using resistance heating, the ratio of hydrogen can usually achieve 80 percent, when maintaining safety conditions even 100 percent. The crystals prepared by the aforementioned technique have better luminescence properties. The recognized qualitative parameter, called Figures of Merit ("FOM") in the technical literature, the value of which represents the ratio of the measured amount of absorption at the wavelength of 490 nm to the measured amount of absorption at the wavelength of 800 nm, is used for determining the efficiency of crystals. Generally, the FOM indicator in titanium-doped sapphire crystals ranges from 30 to 50. In other monocrystalline materials, the typical performance indicator ranges from 1 to 30. The higher the performance indicator FOM is, the higher the laser efficiency of a crystal. When using the above mentioned methods, FOM may achieve values from 30 to 100, or higher, if the concentration of titanium ions is very low—at values typically lower than 0.05 atmospheric percent in the crystal.

U.S. Pat. No. 4,587,035 discloses heating of titanium-doped crystals in a vacuum in order to increase their FOM parameter, in order to increase their lasing efficiency. According to the findings of the inventors, the titanium ions are capable of generating laser radiation only if they are in the $Ti^{+3}$ oxidation state and if the configuration of the outer electronic shell is $3d^1$. That means that the 3d electronic shell contains one unpaired electron. On the other hand, the most stable natural configuration of the titanium ion is $Ti^{+4}$ with an electronic configuration of $3d^0$, i.e. the d-shell contains no unpaired electron. Based on this fact, when growing crystals, equilibrium is established between the titanium ions being present in the different oxidation states $Ti^{+3}$ and $Ti^{+4}$.

The ratio between the $Ti^{+3}$ and $Ti^{+4}$ ions is dependent on the electron affinity of the other constituents present in the initial mixture for forming of crystals. If the electron affinity of other constituents is high, the portion of $Ti^{+3}$ ions in the mixture will remain high as well. Conversely, if any of the other crystal forming constituents have low electron affinity, the amount of $Ti^{+3}$ ions available will be also low. Generally, there are always $Ti^{+4}$ ions present in the molten mixture of constituents during the growth of the titanium-doped crystals, which is caused by the presence of oxygen or reactive oxygen containing substances. These $Ti^{+4}$ ions are incorporated into the growing crystals in conjunction with the $Ti^{+3}$ ions.

In case of optical pumping of a laser crystal containing $Ti^{+3}$ ions, the electron in the 3d electronic shell advantageously absorbs energy corresponding to a particular wavelength and is shifted to an outer electronic shell, which is the 4f shell. Then the electron is de-energized and it returns to its original configuration $3d^1$ with a concomitant release of light energy. In case such material is placed into the laser resonator, which is formed by a pair of specifically designed mirrors (a technique which is well known to those skilled in the art), it is possible to amplify and possibly control the light emitting so as to produce the desired laser light.

However, apart from this desired absorption of light energy which activated the sole electron from the $3d^1$ layer to higher electron layers, at the same time an undesired absorption of energy of the laser light arising in the deactivation of the excited electron and its transfer from a higher electron layer into its original position $3d^1$ occurs. This undesired absorption of laser light is supposedly caused by the $Ti^{+4}$ ions which form the $Ti^{+3}:Ti^{+4}$ couples. These couples cause an optical absorption band at longer wavelengths than the absorption band of the $Ti^{+3}$ ions which activate the $3d^1$ electrons. Because the absorption band caused by the presence of $Ti^{+4}$ in the crystal is of longer wavelength than that of the $Ti^{+3}$ ions, it frequently overlaps the lasing wavelength of the $Ti^{+3}$ ion and therefore manifests itself as an optical loss which decreases the energy of the lasing beam. In numerous cases, depending upon the titanium concentration, optical losses reach levels that effectively prevent the crystals from lasing at all.

Further relevant technological processes which may increase the effective output of luminescence from a titanium-doped sapphire crystal were disclosed in the following patents: U.S. Pat. No. 3,715,194, U.S. Pat. No. 4,038,117, U.S. Pat. No. 4,587,035, U.S. Pat. No. 4,711,696, U.S. Pat. No. 4,765,925, U.S. Pat. No. 4,824,598, U.S. Pat. No. 4,836,953, and U.S. Pat. No. 4,988,402. At the same time, it was determined that in the protective reduction atmosphere containing hydrogen a significant decomposition of the matrix to gaseous aluminium suboxides occurs, and at the same time titanium ions are evaporated, which may lead to undesirable reduction of titanium concentration in the crystal. The time of treatment of crystals depends on the required FOM of the crystal, as well as on the tempering temperature and the concentration of hydrogen used. As has been mentioned, at temperatures required by the process, hydrogen reacts with the sapphire. This results in the creation of unstable aluminium suboxides, such as $Al_2O$, which are in the gaseous phase and which are conducted by a temperature gradient to colder places in the tempering furnace where they sediment and crystallize. This process leads to the losses of mass of the titanium-doped crystal. When annealing smaller crystals or smaller semi-finished crystals, the process takes place relatively slowly and may be controlled. When annealing bigger crystals, this process becomes significant and demonstrably reduces the economic efficiency of this technological treatment.

At present, these bigger crystals have 15 to 20 fold volume. The treatment time increased from hours to weeks or more. For example, a treatment of a sapphire crystal of a cylindrical shape with a diameter about 25 cm and the figure of merit from about 60 to about 80 to the figure of merit of about 120, at a temperature of 1900° C. to 2050° C. and hydrogen concentration about 50 volume percent, requires approximately 300 to 500 hours. At the temperatures required by the process, hydrogen reacts with the sapphire. This results in the creation of unstable aluminium suboxides, such as $Al_2O$, which are conducted from the reaction chamber by the surrounding reduction atmosphere. This process leads to a considerable loss of part of the tempered crystal. When annealing smaller crystals or smaller semi-finished crystals, the process takes place relatively slowly and may be controlled. When annealing bigger crystals, a significant loss of material occurs and in principle this process cannot be applied, since the surface reaction and the subsequent evaporating of sapphire for such a long period complicates the process.

In order to minimize the above mentioned problems, a certain partial pressure of the gaseous aluminium suboxides must be maintained in the surrounding atmosphere. Due to this reason it is necessary to modify the atmosphere by creating a certain partial pressure of the gaseous aluminium suboxides. This method of increasing the luminescence efficiency of titanium-doped oxide crystal when maintaining the constant partial pressure of the aluminium suboxides is the subject-matter of the present invention.

Briefly, the current state of technology of growing titan sapphire has significant problems in minimising the amount of $Ti^{+4}$ ions, and the concentration of $Ti^{+3}:Ti^{+4}$ couples, both when growing the crystals and when subsequently tempering them. The subject-matter of the present invention deals with these problems.

The subject matter discussed in this background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions.

SUMMARY OF THE INVENTION

The disadvantages and limitations of the background art discussed above are overcome by the present invention. With this invention, a method of increasing the luminescence efficiency of titanium-doped oxide crystal, suitable as a laser material, is accomplished by tempering the oxide crystal at a temperature from 1750° C. to 50° C. below the melting point of the oxide crystal in protecting atmosphere which contains at least 40 volume percent of hydrogen and contains aluminium suboxide $Al_2O$ gas with a constant partial pressure.

In a first method embodiment to increase the luminescence efficiency of titanium-doped oxide crystal suitable as a laser material, the oxide crystal is tempered at a temperature from 1750° C. to 50° C. below the melting point of the oxide crystal in a protecting atmosphere containing at least 40 volume percent of hydrogen and containing aluminium suboxide $Al_2O$ gas with a constant partial pressure.

In a preferred embodiment, the protecting atmosphere contains at least 50 volume percent of hydrogen. In another preferred embodiment, the protecting atmosphere contains at least 75 volume percent of hydrogen.

In yet another preferred embodiment, the temperature in the tempering step is maintained in the range of about 80° C. to 50° C. below the melting point of the oxide crystal.

In still another preferred embodiment, the titanium content in the oxide crystal is from 0.02 atomic percent to 1.0 atomic percent.

In another preferred embodiment, the oxide crystal is tempered at a temperature ranging from 1750° C. to 2000° C. for a period longer than about 50 hours. In yet another preferred embodiment, the oxide crystal is tempered at a temperature higher than 1800° C. for a period longer than about 50 hours.

In still another preferred embodiment, the constant partial pressure of aluminium suboxide $Al_2O$ gas is achieved by surrounding titanium-doped oxide crystals in the tempering furnace with blanks manufactured from non-doped sapphire.

Preferably, the titanium-doped oxide crystal is selected from crystal matrices $Al_2O_3$, $Y_3Al_5O_{12}$, $YAlO_3$, $MgAlO_4$, and $LaMgAl_{11}O_{10}$. Most preferably the titanium-doped oxide crystal is sapphire $Ti^{+3}:Al_2O_3$.

In a second method embodiment to increase the luminescence efficiency of titanium-doped oxide crystalsuitable as a laser material, the oxide crystal is tempered at a temperature from 1750° C. to 50° C. below the melting point of the oxide crystal in a protecting atmosphere containing at least 40 volume percent of hydrogen and containing aluminium suboxide $Al_2O$ gas with a constant partial pressure; wherein the quantitative parameter Figures of Merit of the oxide crystal is greater than 120.

In a preferred embodiment, the crystal has as its smallest mean cross-sectional thickness about 30 centimeters. In another preferred embodiment, the crystal has as its smallest mean cross-sectional thickness about 5 centimeters.

In yet another preferred embodiment, the pressure is between 0.001 bar and 1000 bar. In still another preferred embodiment, the pressure is between 0.01 bar and 10 bar.

In another preferred embodiment, the heating and cooling rates are less than 50° C. change per hour.

In a third method embodiment to increase the luminescence efficiency of titanium-doped oxide crystalsuitable as a laser material, the oxide crystal is tempered at a temperature from 1750° C. to 2000° C. in a protecting atmosphere containing at least 50 volume percent of hydrogen and containing aluminium suboxide $Al_2O$ gas with a constant partial pressure between 0.01 bar and 10 bar; wherein the heating and cooling rates are less than 50° C. change per hour.

In a preferred embodiment, the titanium content in the oxide crystal is from 0.02 atomic percent to 1.0 atomic percent.

In another preferred embodiment, the oxide crystal is tempered for a period longer than about 50 hours.

In still another preferred embodiment, the constant partial pressure of aluminium suboxide $Al_2O$ gas is achieved by surrounding titanium-doped oxide crystals in the tempering furnace with blanks manufactured from non-doped sapphire.

DETAILED DESCRIPTION OF AN EXEMPLARY EMBODIMENT

As mentioned above, the present invention provides a method of increasing the luminescence efficiency of titanium-doped oxide crystal, suitable as a laser material, by tempering the oxide crystal at a temperature from 1750° C. to 50° C. below the melting point of the oxide crystal in protecting atmosphere which contains at least 40 volume percent of hydrogen and contains aluminium suboxide $Al_2O$ gas with a constant partial pressure.

The increased luminescence efficiency of titanium-doped oxide crystal means that by applying the method of the present invention its efficiency Figures of Merit ("FOM") increases typically by at least 10 to 50 percent, and often by 100 percent compared to previous technological treatments. For example, in case of sapphire titanium-doped crystals, FOM increases at least to 120, and usually FOM achieves the value of 200 or more, depending on the titanium ions concentration in the oxide crystal.

The method according to this invention may be used for treatment of titanium-doped laser oxide crystals in any suitable form. For instance, the crystal boule as made from the melt may be treated in accordance with this invention as well as any crystal article obtained therefrom, such as the crystal in the form of laser rods. Often, the crystal has as its smallest mean cross-sectional thickness about 30 centimeters, preferably less than 5 centimeters. Larger crystals can be used, but the treatment may have to be conducted for longer periods of time.

The atmosphere must contain at least 40 percent by volume of hydrogen. It has been determined that at lower hydrogen concentrations, the rate of improvement can be unduly slow for commercial operations. The atmosphere may further contain inert components such as argon. The method may be conducted at any convenient pressure from sub-atmospheric to super-atmospheric pressure, e.g., 0.001 bar to 1000 bar. Preferably, the method is at a low super-atmospheric pressure due to safety considerations, although high total pressures will favor advantageously higher partial pressures of hydrogen. The pressures may range from 0.01 to 10 bar.

The method can be used in the treatment of freshly grown oxide crystals, as well as for the treatment of existing oxide crystals.

Essentially any oxide crystal which is capable of being doped with titanium and which is likely to provide laser generation may be treated by the method of the present invention to provide an oxide capable of generating laser radiation, the FOM of which is substantially higher than the one achieved by previous treatments. The suitable titanium-doped oxide host crystals include, but are not limited to: titanium-doped spinel ($Ti:MgAlO_4$); titanium-doped yttrium aluminate ($Ti:YAl_2O_3$); titanium-doped yttrium garnate ($Ti:Y_3Al_5O_{12}$); titanium-doped lanthanum magnesium aluminate ($Ti:LaMgAl_{11}O_{19}$); titanium-doped gadolinium scandate ($Ti:GdScO_3$); titanium-doped scandium borate ($Ti:ScBO_3$); and optionally other titanium-doped oxide host crystals.

Regardless of the host oxide crystal material being used, it has been determined that when the material is titanium-doped and it is treated by the method of the present invention, i.e., the material heat treated in atmosphere containing hydrogen and containing the corresponding part of aluminium suboxide, the undesirable (parasitic) absorption of $Ti^{+3}:Ti^{+4}$ couples in the luminescence area (950 nm to 1100 nm) is essentially eliminated, producing a titanium-doped oxide crystal with substantially improved efficiency (FOM) which is higher than 120. It has been further determined if the material is titanium-doped and treated by the method of the present invention, i.e., the material heat treated in atmosphere containing hydrogen and containing the corresponding part of aluminium suboxide, the undesirable (parasitic) absorption of $Ti^{+3}:Ti^{+4}$ couples in the luminescence area (950 nm to 1100 nm) is essentially eliminated, producing a titanium-doped oxide crystal with significantly improved efficiency (FOM) which is usually higher than 120 even for concentrations of titanium ions higher than 0.05 atmospheric percent in the treated crystal.

The increase of FOM in the titanium-doped laser crystal by means of the present invention is caused by the reduction of the content of $Ti^{+4}$ ions, increasing the content of $Ti^{+3}$ ions and destroying $Ti^{+3}:Ti^{+4}$ couples contained in the crystal as a result of the treatment. Due to the higher separation of titanium ions in the crystal, the method requires more time.

Increasing the temperature within the range reduces the time required to provide higher values of FOM. Thus, temperatures from 1850° C. to 2025° C., preferably about 1900° C. to 2000° C., are frequently employed for sapphire crystals. For other crystals, their respective melting points will dictate the maximum allowable temperature to which they may be heat treated. As with sapphire, subjecting the titanium-doped oxide crystal as closely as possible to the maximum allowable temperature will generally reduce the time required to provide the required increase in the FOM.

The rate of heating and cooling of the crystal should be sufficiently slow to avoid inducing undue stress in the article. The rate will therefore depend upon the size and configuration of the crystal, as well as upon the thermal shock resistance of the particular crystal material. Usually, the heating and cooling rates are less than 50° C. change per hour.

The duration of the process depends upon the FOM required for the given crystal and upon the temperature and hydrogen concentration employed. The current development of laser technology and the use thereof requires substantially larger crystals than those used in the past.

The method according to this invention may be used for any titanium-doped oxide crystal of any initial value of the Figure of Merit. Before the treatment, crystals usually have a Figure of Merit between 1 and 50, and typically between 1 and 10.

In a preferred embodiment, the protecting atmosphere contains at least 50 volume percent of hydrogen.

In another preferred embodiment, the protecting atmosphere contains at least 75 volume percent of hydrogen.

In a preferred embodiment, the temperature in the tempering step is maintained in the range of about 80° C. to 50° C. below the melting point of the oxide crystal. This is the temperatures at which the crystal starts to be plastic and during tempering its re-crystallization may occur, without altering the shape of the crystal by melting.

In yet another preferred embodiment, the titanium content in the oxide crystal is from 0.02 atomic percent to 1.0 atomic percent.

In another preferred embodiment, the oxide crystal is tempered at a temperature ranging from 1750° C. to 2000° C. for a period longer than about 50 hours.

In yet another preferred embodiment, the oxide crystal is tempered at a temperature higher than 1800° C. for a period longer than about 50 hours.

In one preferred embodiment, the constant partial pressure of aluminium suboxide $Al_2O$ gas is achieved by surrounding titanium-doped oxide crystals in the tempering furnace with blanks manufactured from non-doped sapphire. Surrounding the oxide crystal by blanks manufactured from non-doped sapphire increases the suboxide partial pressure of aluminium suboxides and thus minimizes the losses of the tempered crystal, and at the same time secures the correct processes securing the transition of the tetravalent titanium to trivalent titanium, and thus reduces the concentration of their couples causing the undesired (parasitic) absorption in the area of luminescence spectra of titanium. In particular with titanium-doped sapphire, it is the area from 650 nm to 1100 nm.

Preferably, the titanium-doped oxide crystal is selected from one of the crystal matrices $Al_2O_3$, $Y_3Al_5O_{12}$, $YAlO_3$, $MgAlO_4$, and $LaMgAl_{11}O_{10}$.

Most preferably the titanium-doped oxide crystal is sapphire $Ti^{+3}$:$Al_2O_3$.

EXAMPLES

Various titanium-doped sapphire crystals in the form of discs of a circular cross-section were inserted into the tempering furnace, so that they were surrounded by blanks from non-doped sapphire. This treatment created local conditions in the protecting atmosphere and ensured the constant partial pressure of gaseous aluminium suboxides, in particular of $Al_2O$, in the closest vicinity of the tempered crystals. As it was not possible to measure directly the partial pressure of these aluminium suboxides, a comparison of two identical samples of titanium-doped sapphire was made, one surrounded by non-doped sapphire (sample 1), the second one without the surrounding (sample 2). Both samples were tempered in the protecting atmosphere at a pressure of $10^5$ Pa, the atmosphere containing 80 volume percent of hydrogen ($H_2$) and 20 volume percent of argon (Ar), at a temperature of 1980° C. for the period of 50 hours. From the weight difference of sample 1 and sample 2, the difference in relative partial pressure of aluminium suboxides was calculated. The calculations showed that the partial pressure was $1.66 \times 10^2$ Pa.

For a qualified estimate of the changes in the partial pressure of aluminium suboxides, depending on the hydrogen concentrations, a similar experiment was carried out with the difference that the protecting atmosphere contained 100 volume percent of hydrogen ($H_2$). After performing the calculations, it was found that the relative difference represents the value of $3.3 \times 10^3$ Pa.

The luminescence efficiency or FOM was measured for each crystal tempered surrounded by non-doped sapphire before tempering and after tempering. Tables I and II relate to sapphire crystals only. Table III relates to crystals other than sapphire. Table I describes the crystals from the point of view of their parameters, and Table II brings the summary of tempering conditions, and the change in FOM efficiency of given crystals. Table III sets forth the treatment conditions and results for the crystals other than sapphire. For the examples shown in Table III, the $Ti^{+3}$ content in the melt is about 1% atomic weight. However, due to differences in the distribution coefficient for the respective crystals, the amount of $Ti^{+3}$ that ultimately ends up in the crystal is generally about 5 to 10 times lower than the amount present in the melt, i.e., in a range of from about 0.1% to about 0.2% atomic weight.

After the treatment, the crystals which serve as amplifiers of laser radiation show significantly higher parameters of amplification. At the same time, a lower threshold of occurrence of undesirable amplified spontaneous emission was observed. For example, the threshold of this undesirable spontaneous emission of crystal B before the treatment was 8 J, after the treatment it is only around 6.2 J. Similarly, the amplification of the laser at the same value of laser pumping of 5 J increases: in crystal B, the amplification value is 7.5 before the treatment and 9.8 after the treatment.

TABLE I

| | Dimensions in mm | | | |
|---|---|---|---|---|
| Crystal | Diameter | Thickness | $Ti^{+3}$ | Contents |
| A | 60.0 | 5.0 | 0.1% | atomic |
| B | 100.0 | 8.0 | 0.05% | atomic |
| C | 50.0 | 5.0 | 0.08% | atomic |
| D | 75.0 | 6.3 | 0.14% | atomic |
| E | 155.0 | 10.0 | 0.05% | atomic |
| F | 320.0 | 15.0 | 0.03% | atomic |
| G | 275.0 | 7.5 | 0.24% | atomic |

TABLE II

| Number Crystal | Atmosphere | | Pressure (atm) | Heating/Cooling Rate (° C./hr) | Annealing | | FOM | |
|---|---|---|---|---|---|---|---|---|
| | Ar. Vol. % | H2. Vol. % | | | Time (hr) | Temp (° C.) | Before | After |
| A | 20 | 80 | 1 | 100 | 400 | 1900 | 14.3 | 138 |
| B | 20 | 80 | 1 | 100 | 450 | 1900 | 28.7 | 218 |
| C | 51 | 49 | 1 | 50 | 400 | 1950 | 22.0 | 145 |
| D | 51 | 49 | 1 | 50 | 350 | 1950 | 9.7 | 120 |
| E | 50 | 50 | 1 | 50 | 600 | 1975 | 28.0 | 289 |
| F | 20 | 80 | 1 | 50 | 900 | 1970 | 40.0 | 640 |
| G | 25 | 75 | 1 | 50 | 750 | 1980 | 7.2 | 188 |

TABLE III

| Number Crystal | Atmosphere | | Pressure (atm) | Heating/Cooling Rate (° C./hr) | Annealing | | FOM | |
|---|---|---|---|---|---|---|---|---|
| | Ar. Vol. % | H2. Vol. % | | | Time (hr) | Temp (° C.) | Before | After |
| $MgAlO_4$:Ti | 20 | 80 | 1 | 100 | 48 | 1870 | 9.5 | 156 |
| $YAlO_3$:Ti | 20 | 80 | 1 | 100 | 75 | 1780 | 28.3 | 100 |
| $Y_3Al_5O_{12}$:Ti | 50 | 50 | 1 | 50 | 60 | 1850 | 20.0 | 125 |
| $LaMgAl_{11}O_{10}$:Ti | 25 | 75 | 1 | 50 | 48 | 1950 | 35.0 | 210 |
| $Gd_3Sc_2Al_3O_{12}$:Ti | 50 | 50 | 1 | 50 | 80 | 1910 | 10.0 | 100 |

Only samples of these crystals were tested. Each sample was a 6 mm diameter cylinder, 10-20 mm long.

INDUSTRIAL APPLICABILITY

Crystals treated by the method according to this invention are applicable as tunable laser material having the required FOM value, depending on the concentration of titanium ions in crystals. The advantage of this method is that primarily big semi-finished products of laser elements can be treated by means of this method. The crystals treated by the method according to this invention achieve a considerable increase of FOM efficiency compared to previous methods, at least by 10 percent, usually by 50 percent and in case of lower atomic concentrations of titanium ions by 100 percent or more.

The method disclosed in this invention provides the increase in luminescence efficiency of big titanium-doped oxide crystals having diameter of 30 cm to 40 cm. A considerable advantage of this method is its efficiency and the capability of improving existing titanium-doped oxide crystals.

Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

While the current application recites particular combinations of features in the claims appended hereto, various embodiments of the invention relate to any combination of any of the features described herein whether or not such combination is currently claimed, and any such combination of features may be claimed in this or future applications. Any of the features, elements, or components of any of the exemplary embodiments discussed above may be claimed alone or in combination with any of the features, elements, or components of any of the other embodiments discussed above.

What is claimed is:

1. A method of increasing the luminescence efficiency of titanium-doped oxide crystal, suitable as a laser material, comprising:
    tempering the oxide crystal at a temperature from 1750° C. to 50° C. below the melting point of the oxide crystal in a protecting atmosphere containing at least 40 volume percent of hydrogen and containing aluminium suboxide $Al_2O$ gas with a constant partial pressure.

2. The method of increasing the luminescence efficiency of titanium-doped oxide crystal defined in claim 1, wherein the protecting atmosphere contains at least 50 volume percent of hydrogen.

3. The method of increasing the luminescence efficiency of titanium-doped oxide crystal defined in claim 1, wherein the protecting atmosphere contains at least 75 volume percent of hydrogen.

4. The method of increasing the luminescence efficiency of titanium-doped oxide crystal defined in claim 1, wherein the temperature during the tempering remains in the range from 80° C. to 50° C. below the melting point of the oxide crystal.

5. The method of increasing the efficiency of titanium-doped oxide crystal defined in claim 1, wherein the titanium content in the crystal is from 0.02 to 1.0 atomic percent.

6. The method of increasing the efficiency of titanium-doped oxide crystal defined in claim 1, wherein the oxide crystal is tempered at a temperature ranging from 1750° C. to 2000° C. for a period longer than 50 hours.

7. The method of increasing the efficiency of titanium-doped oxide crystal defined in claim 6, wherein the oxide crystal is tempered at a temperature higher than 1800° C. for a period longer than 50 hours.

8. The method of increasing the efficiency of titanium-doped oxide crystal defined in claim 1, wherein the constant partial pressure of aluminium suboxide $Al_2O$ gas is achieved by surrounding titanium-doped oxide crystals in the tempering furnace with blanks from non-doped sapphire.

9. The method of increasing the luminescence efficiency of titanium-doped oxide crystal defined in claim 1, wherein the titanium-doped oxide crystal is one of the group of crystal matrices comprising the crystal matrices $Al_2O_3$, $Y_3Al_5O_{12}$, $YAlO_3$, $MgAlO_4$, and $LaMgAl_{11}O_{10}$.

10. The method of increasing the luminescence efficiency of titanium-doped oxide crystal defined in claim 9, wherein the titanium-doped oxide crystal comprises sapphire $Ti:Al_2O_3$.

11. A method of increasing the luminescence efficiency of titanium-doped oxide crystal, suitable as a laser material, comprising:
tempering the oxide crystal at a temperature from 1750° C. to 50° C. below the melting point of the oxide crystal in a protecting atmosphere containing at least 40 volume percent of hydrogen and containing aluminium suboxide $Al_2O$ gas with a constant partial pressure;
wherein the quantitative parameter Figures of Merit of the oxide crystal is greater than 120.

12. The method of increasing the luminescence efficiency of titanium-doped oxide crystal defined in claim 11, wherein the crystal has as its smallest mean cross-sectional thickness about 30 centimeters.

13. The method of increasing the luminescence efficiency of titanium-doped oxide crystal defined in claim 12, wherein the crystal has as its smallest mean cross-sectional thickness about 5 centimeters.

14. The method of increasing the luminescence efficiency of titanium-doped oxide crystal defined in claim 11, wherein the pressure is between 0.001 bar and 1000 bar.

15. The method of increasing the luminescence efficiency of titanium-doped oxide crystal defined in claim 14, wherein the pressure is between 0.01 bar and 10 bar.

16. The method of increasing the luminescence efficiency of titanium-doped oxide crystal defined in claim 11, wherein the heating and cooling rates are less than 50° C. change per hour.

17. A method of increasing the luminescence efficiency of titanium-doped oxide crystal, suitable as a laser material, comprising:
tempering the oxide crystal at a temperature from 1750° C. to 2000° C. in a protecting atmosphere containing at least 50 volume percent of hydrogen and containing aluminium suboxide $Al_2O$ gas with a constant partial pressure between 0.01 bar and 10 bar;
wherein the heating and cooling rates are less than 50° C. change per hour.

18. The method of increasing the luminescence efficiency of titanium-doped oxide crystal defined in claim 17, wherein the titanium content in the crystal is from 0.02 to 1.0 atomic percent.

19. The method of increasing the luminescence efficiency of titanium-doped oxide crystal defined in claim 17, wherein the oxide crystal is tempered for a period longer than 50 hours.

20. The method of increasing the luminescence efficiency of titanium-doped oxide crystal defined in claim 17, wherein the constant partial pressure of aluminium suboxide $Al_2O$ gas is achieved by surrounding titanium-doped oxide crystals in the tempering furnace with blanks from non-doped sapphire.

* * * * *